(12) United States Patent
Roth

(10) Patent No.: US 12,119,284 B2
(45) Date of Patent: Oct. 15, 2024

(54) DBC SUBSTRATE FOR POWER SEMICONDUCTOR DEVICES, METHOD FOR FABRICATING A DBC SUBSTRATE AND POWER SEMICONDUCTOR DEVICE HAVING A DBC SUBSTRATE

(71) Applicant: Infineon Technologies Austria AG, Villach (AT)

(72) Inventor: Alexander Roth, Zeitlarn (DE)

(73) Assignee: Infineon Technologies Austria AG, Villach (AT)

( * ) Notice: Subject to any disclaimer, the term of this patent is extended or adjusted under 35 U.S.C. 154(b) by 184 days.

(21) Appl. No.: 17/690,616

(22) Filed: Mar. 9, 2022

(65) Prior Publication Data

US 2022/0301974 A1    Sep. 22, 2022

(30) Foreign Application Priority Data

Mar. 22, 2021 (DE) .......................... 102021106952.1

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4846* (2013.01); *H01L 21/4857* (2013.01);
(Continued)

(58) Field of Classification Search
CPC ... H01L 23/3735; H01L 23/367; H01L 23/15; H01L 23/49894; H01L 21/4846;
(Continued)

(56) References Cited

U.S. PATENT DOCUMENTS

| 5,176,309 | A | | 1/1993 | Horiguchi et al. |
| 5,912,066 | A | * | 6/1999 | Takahashi ........... H01L 23/3735 |
| | | | | 428/688 |
| 6,066,219 | A | * | 5/2000 | Schulz-Harder ......... H05K 3/38 |
| | | | | 156/89.18 |
| 6,713,373 | B1 | * | 3/2004 | Omstead ........... H01L 21/76873 |
| | | | | 438/650 |

(Continued)

FOREIGN PATENT DOCUMENTS

| DE | 19603822 A1 | 8/1997 |
| DE | 102005042554 A1 | 2/2007 |
| DE | 102008001226 A1 | 10/2008 |
| DE | 102012102611 A1 | 8/2013 |

OTHER PUBLICATIONS

Li, Zhengwen, et al., "Atomic Layer Deposition of Ultrathin Copper Metal Films from a Liquid Copper(I) Amidinate Precursor", Journal of The Electrochemical Society, 153 (11), Department of Chemistry and Chemical Biology, Harvard University, Cambridge 102138, Massachusetts, USA, 2006, pp. C787-C794.

*Primary Examiner* — Alonzo Chambliss
(74) *Attorney, Agent, or Firm* — Murphy, Bilak & Homiller, PLLC

(57) ABSTRACT

A DBC substrate for power semiconductor devices includes a ceramic workpiece of a non-oxide ceramic having first and second opposing main sides, the ceramic workpiece having a thickness of 10 μm or more measured between the first and second main sides, a copper-containing layer disposed over the first main side, the copper-containing layer having a thickness of 5 μm or more, and an intermediate layer comprising $Al_2O_3$ disposed between the ceramic workpiece and the copper-containing layer.

18 Claims, 4 Drawing Sheets

(51) Int. Cl.
*H01L 23/00* (2006.01)
*H01L 23/15* (2006.01)
*H01L 23/367* (2006.01)
*H01L 23/498* (2006.01)

(52) U.S. Cl.
CPC ............ *H01L 23/15* (2013.01); *H01L 23/367* (2013.01); *H01L 23/49894* (2013.01); *H01L 24/30* (2013.01); *H01L 24/33* (2013.01)

(58) Field of Classification Search
CPC ..... H01L 21/4857; H01L 24/29; H01L 24/30; H01L 24/32; H01L 24/33
See application file for complete search history.

(56) References Cited

U.S. PATENT DOCUMENTS

| | | | | |
|---|---|---|---|---|
| 6,764,940 | B1* | 7/2004 | Rozbicki | H01L 21/76865 438/653 |
| 7,186,648 | B1* | 3/2007 | Rozbicki | H01L 21/76843 438/687 |
| 9,012,786 | B2* | 4/2015 | Yano | H01L 23/49833 174/258 |
| 2011/0092023 | A1* | 4/2011 | Liu | H01L 31/0203 438/122 |
| 2012/0243192 | A1* | 9/2012 | Robert | H01L 23/3735 361/767 |

* cited by examiner

DBC SUBSTRATE FOR POWER SEMICONDUCTOR DEVICES, METHOD FOR FABRICATING A DBC SUBSTRATE AND POWER SEMICONDUCTOR DEVICE HAVING A DBC SUBSTRATE

TECHNICAL FIELD

The present disclosure relates generally to DBC substrates for power semiconductor devices, to methods for fabricating DBC substrates and to power semiconductor devices having a DBC substrate.

BACKGROUND

Ceramic substrates are used in many power semiconductor devices, for example, as substrates for power semiconductor chips. A particularly suitable type of ceramic substrates are DBC substrates, in which copper is deposited on an oxide ceramic such as $Al_2O_3$ using a DBC process. However, non-oxide ceramics such as nitride ceramics or carbide ceramics offer certain advantages over oxide ceramics that are useful for power semiconductor devices, e.g., lower thermal resistance and/or a coefficient of thermal expansion that better matches the coefficient of thermal expansion of the power semiconductor chip. Although certain technical solutions exist to perform a DBC process also on a non-oxide ceramic, these solutions are sometimes associated with significant disadvantages, such as high manufacturing costs or long manufacturing times. For these and other reasons, there is a need for improved DBC substrates for power semiconductor devices, for improved methods for fabricating such DBC substrates and for improved power semiconductor devices.

The problem underlying the invention is solved by the features of the independent claims. Advantageous embodiments and further embodiments of the invention are indicated in the dependent claims.

SUMMARY

Individual examples relate to a DBC substrate for power semiconductor devices, wherein the DBC substrate comprises: a ceramic workpiece of a non-oxide ceramic having a first main side and an opposing second main side, the ceramic workpiece having a thickness of 10 μm or more measured between the two main sides; a copper-containing layer disposed over the first main side, the copper-containing layer having a thickness of 5 μm or more; and an intermediate layer comprising $Al_2O_3$ disposed between the ceramic workpiece and the copper-containing layer.

Individual examples relate to a method for fabricating a DBC substrate, the method comprising: providing a ceramic workpiece having a first main side and an opposing second main side, the ceramic workpiece having a thickness of 10 μm or greater as measured between the two main sides, depositing one or more aluminum-containing monolayers on at least the first main side of the ceramic workpiece by atomic layer deposition, and depositing a copper-containing layer over the one or more aluminum-containing monolayers by a direct bonded copper process.

Individual examples relate to a power semiconductor device, comprising: a DBC substrate, wherein the DBC substrate comprises: a ceramic workpiece of a non-oxide ceramic having first and second opposing main sides, the ceramic workpiece having a thickness of 10 μm or greater measured between the two main sides, a copper-containing layer disposed over the first main side, the copper-containing layer having a thickness of 5 μm or greater, and an intermediate layer comprising $Al_2O_3$ disposed between the ceramic workpiece and the copper-containing layer; and a power semiconductor chip disposed on and electrically connected to the DBC substrate.

BRIEF DESCRIPTION OF THE DRAWINGS

The accompanying drawings are examples and, together with the description, serve to explain the basic features of the disclosure. The elements of the drawings are not necessarily to scale with respect to each other. Identical reference signs may denote corresponding, similar or identical parts.

DETAILED DESCRIPTION

Where the terms "including," "having," "with," or other variations thereof are used, either in the detailed description or in the claims, such terms are intended to have an inclusive meaning in a manner similar to the term "comprising." The terms "coupled" and "connected" may be used along with derivations thereof. These terms may be used to indicate that two elements cooperate or interact with each other, whether or not they are in direct physical or electrical contact with each other; intermediate elements or layers may be provided between the "coupled," "attached," or "connected" elements. Further, the term "exemplary" is intended to mean an example and not the best or optimum. It should be understood that the features of the various exemplary embodiments described herein may be combined, unless specifically stated otherwise.

The DBC substrates described below may have any shape, size, and any suitable materials. The DBC substrates may include carriers and connecting leads. The carriers and connecting leads may also be made from a single piece. Separation of the individual DBC substrates may be performed by mechanical sawing, a laser beam, cutting, punching, grinding, milling, etching, or any other suitable method.

The power semiconductor devices described below may have a cast material (mold material) covering at least portions of the components of the power semiconductor devices. The mold material may be any suitable thermoplastic or thermosetting material. Various techniques may be used to cover the components with the cast material, for example, compression molding, injection molding, powder melting, or liquid casting.

An efficient method for fabricating DBC substrates, as well as efficient power semiconductor devices with DBC substrates, can reduce for example material consumption, chemical waste, or ohmic losses, thus enabling energy and/or resource savings. Improved DBC substrates, as well as improved power semiconductor devices with DBC substrates, as disclosed in this description, can thus at least indirectly contribute to "green technology" solutions, i.e. climate-friendly solutions that enable a reduction of energy and/or resource consumption.

Figure 1:
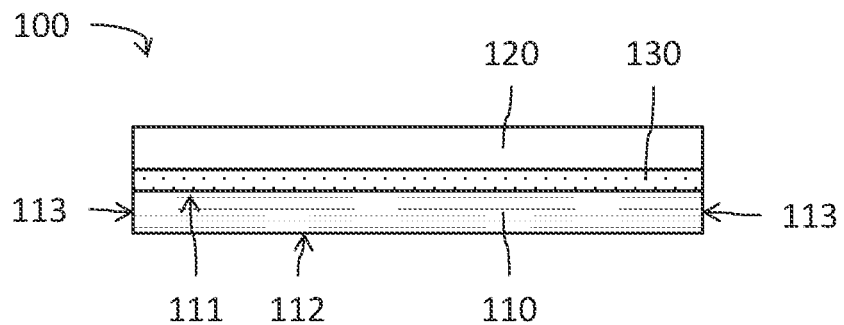
FIG. 1 shows a sectional view of a DBC substrate having an intermediate layer disposed between a ceramic layer and a copper-containing layer of the DBC substrate, the intermediate layer comprising $Al_2O_3$ and possibly also $CuAl_2O_4$.

FIG. 1 shows a DBC (direct bonded copper) substrate 100 configured for use in a power semiconductor device and/or a Peltier element (also referred to as a "thermo electric cooler", TEC). The DBC substrate 100 includes a ceramic workpiece 110, a copper-containing layer 120, and an intermediate layer 130.

The ceramic workpiece 110 comprises a first main side 111 and an opposing second main side 112. The ceramic workpiece 110 further comprises a thickness of 10 μm or more as measured between the two main sides 111, 112. The thickness of the ceramic workpiece 110 may be, for example, 20 μm or more, 50 μm or more, 100 μm or more, or 300 μm or more, particularly 50 μm to 300 μm. The ceramic workpiece may have, for example, a flat geometry, such as in the form of a cuboid, but it may have any other suitable three-dimensional geometry. The ceramic workpiece 110 comprises a non-oxide ceramic.

The copper-containing layer 120 is disposed over the first main side 111 of the ceramic workpiece. The copper-containing layer 120 further has a thickness of 5 μm or more as measured perpendicular to the main sides 111, 112. The thickness of the copper-containing layer 120 may be, for example, 7 μm or more, 10 μm or more, 15 μm or more, or 20 μm or more, or 50 μm or more, particularly 100 μm to 300 μm.

The copper-containing layer 120 may consist entirely of Cu, or it may comprise Cu and one or more other components. The copper-containing layer 120 may also comprise or consist of a copper alloy. The copper-containing layer 120 may be a non-structured (homogeneous) layer or it may have a structure, such as connection regions electrically isolated from each other by trenches and/or conductive tracks for connecting one or more semiconductor chips.

The intermediate layer 130 is disposed between the ceramic workpiece 110 and the copper-containing layer 120. The intermediate layer 130 may, for example, completely cover the first main side 111 of the ceramic workpiece 110. The intermediate layer 130 may be disposed directly on the first main side 111. In turn, the copper-containing layer 120 may be disposed directly on the intermediate layer 130. The intermediate layer 130 comprises $Al_2O_3$, for example in the form of one or more monolayers, or it consists entirely of $Al_2O_3$. According to an example, the intermediate layer 130 may also comprise $CuAl_2O_4$, e.g. also in the form of one or more monolayers. The $CuAl_2O_4$ may be disposed, for example, between the $Al_2O_3$ and the copper-containing layer 120. The intermediate layer 130 may be, for example, the product of a spinel reaction of the ceramic workpiece 110 with copper deposited on the ceramic workpiece 110. The intermediate layer 130 may be, for example, no more than a few atomic layers thick, or it may be, for example, no more than a few hundred nanometers thick.

According to an example, the intermediate layer 130 is arranged on the first main side 111 but not on the second main side 112 of the ceramic workpiece 110, as shown in FIG. 1. According to another example, the intermediate layer 130 is arranged on both main sides 111, 112, and in particular, the intermediate layer 130 may completely cover both main sides 111, 112.

According to one example, the intermediate layer 130 is the result of aluminum-containing monolayers deposited on the ceramic workpiece 110 by means of atomic layer deposition. This will be discussed in more detail below. According to an example, the one or more aluminum-containing monolayers are deposited only on the first main side 111 of the ceramic workpiece 110, and according to another example, the one or more aluminum-containing monolayers are deposited on all sides of the ceramic workpiece 110.

The ceramic workpiece 110 may further include lateral sides 113 connecting the two main sides 111, 112. According to an example, the intermediate layer 130 is also disposed on the lateral sides 113, and in particular, the intermediate layer 130 may completely cover all lateral sides 113. According to another example, the lateral sides 113 are free of the intermediate layer 130. At locations where the intermediate layer 130 is not covered by the copper-containing layer 120, the intermediate layer 130 may be free of $CuAl_2O_4$. At these locations, it is possible that the interlayer 130 only comprises $Al_2O_3$. However, at locations where the intermediate layer 130 is covered by the copper-containing layer 120, it is possible that the intermediate layer 130 also comprises $CuAl_2O_4$.

According to an example, the ceramic workpiece 110 comprises or consists of a non-oxide ceramic comprising one or more of $Si_3Ni_4$, AlN, BN (especially cBN or hBN), SiC, and BC. Such ceramics may have certain advantages over oxide ceramics, such as a lower thermal resistance or a coefficient of thermal expansion (CTE) that is better matched to the CTE of a semiconductor chip.

Figure 2A:
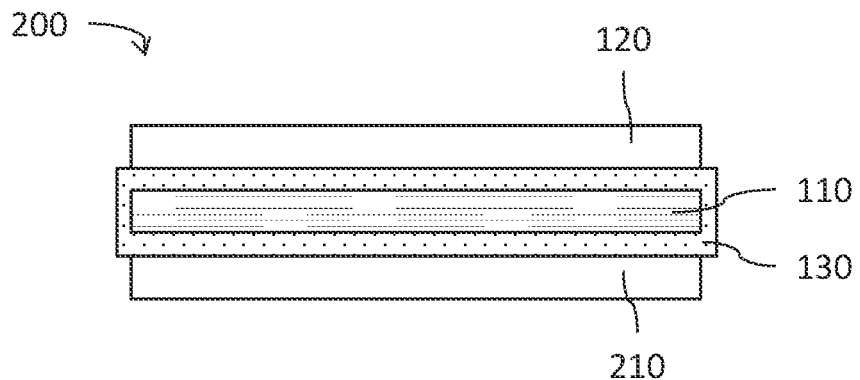
FIGS. 2A and 2B show sectional views of DBC substrates configured for indirect cooling (FIG. 2A) and direct liquid cooling (FIG. 2B), respectively.
Figure 2B:
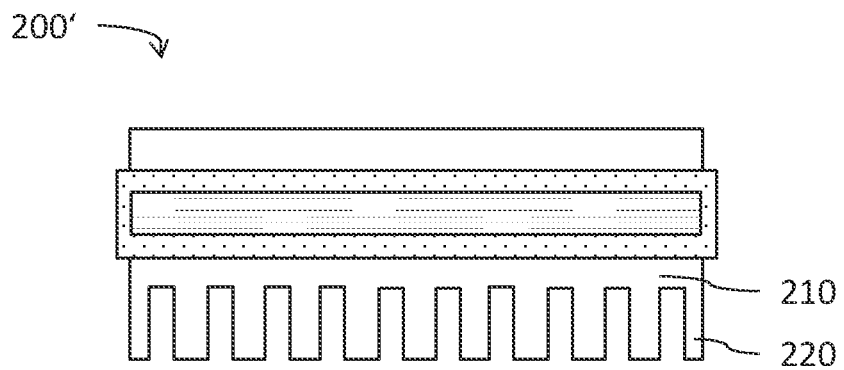

FIGS. 2A and 2B show other DBC substrates 200 and 200', which may be similar or identical to the DBC substrate 100 of FIG. 1, except for the differences described below. In particular, the DBC substrates 200 and 200' each have a copper-containing layer over both main sides 111, 112 of the ceramic workpiece 110.

FIG. 2A shows a DBC substrate 200 that comprises a second copper-containing layer 210 on the second main side 112 of the ceramic workpiece 110, in addition to the copper-containing layer 120. The copper-containing layer 120 and the second copper-containing layer 210 may have identical or similar dimensions, or they may have different dimensions. For example, the copper-containing layers 120, 210 may have different thicknesses.

The second copper-containing layer 210 may be disposed directly on the intermediate layer 130. The second copper-containing layer 210 may be a non-structured (homogeneous) layer, or it may have a structure, such as connection regions and/or conductive tracks electrically isolated from each other by trenches.

FIG. 2B shows a DBC substrate 200' in which the second copper-containing layer 210 is formed as a cooling structure. For example, the second copper-containing layer 210 may include cooling fins 220. For example, the DBC substrate 200' may be configured for direct liquid cooling.

With reference to FIGS. 3A-3E, an exemplary method for fabricating a DBC substrate is illustrated. This exemplary method can be used, for example, to fabricate the DBC substrates 100, 200, and 200'.

Figure 3A:
FIGS. 3A through 3E show sectional views of a DBC substrate in various stages of fabrication according to an exemplary method for fabricating DBC substrates.

As shown in FIG. 3A, the ceramic workpiece 110 is provided. The providing may comprise cleaning the surfaces of the ceramic workpiece 110. The ceramic workpiece 110 may be provided in any suitable sizes.

Figure 3B:
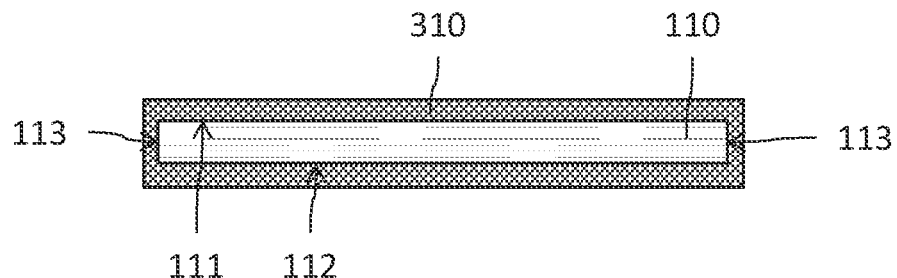

As shown in FIG. 3B, one or more aluminum-containing monolayers 310 are deposited on at least the first main side 111 of the ceramic workpiece 110. However, it is also possible that the one or more aluminum-containing monolayers 310 are also deposited on the second main side 112 and possibly also on the lateral sides 113. After deposition, the aluminum-containing monolayers 310 may comprise or consist of, for example, $Al_2O_3$.

According to an example, a patterning process is used to pattern the one or more aluminum-containing monolayers 310 such that the one or more aluminum-containing monolayers 310 are removed again from those locations on the ceramic workpiece 110 that are to be free of the copper-containing layer 120. According to another example, the one or more aluminum-containing monolayers 310 are not patterned and also cover those locations on the ceramic workpiece 110 on which copper is not deposited.

Any suitable deposition process may be used to deposit the one or more aluminum-containing monolayers 310, such as atomic layer deposition ("ALD"). For example, trimethylaluminum (TMA) and water or other suitable precursors can be used in an ALD process to fabricate the one or more aluminum-containing monolayers 310. The ALD process may, for example, occur at elevated temperatures in a furnace. The ALD process may comprise, for example, one or more cycles consisting of a TMA application step, followed by a rinsing step, followed by an $H_2O$ application step, followed by another rinsing step.

According to an example, multiple aluminum-containing monolayers are deposited, in particular 5 to 50 monolayers or 10 to 30 monolayers or 20 to 30 monolayers. According to another example, a single aluminum-containing monolayer is deposited. In particular, the one or more aluminum-containing monolayers 310 may serve to thoroughly cover the ceramic workpiece 110 to ensure good adhesion of the copper-containing layer 120 to be subsequently applied. In particular, since the ceramic workpiece 110 comprises a non-oxide ceramic (e.g., a nitride ceramic or a carbide ceramic), it may be paramount to improve adhesion in this manner, since a DBC process otherwise cannot be performed on such ceramics.

Figure 3C:
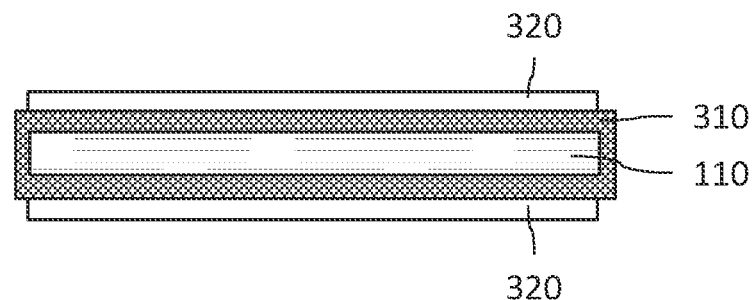

FIG. 3C shows an optional process of the method, according to which one or more copper-containing monolayers 320 are deposited on the one or more aluminum-containing monolayers 310. The deposition of the one or more copper-containing monolayers 320 may be performed using, for example, atomic layer deposition.

According to an example, 5 to 50, in particular 10 to 30, copper-containing monolayers are deposited on the one or more aluminum-containing monolayers 310. According to another example, only a single copper-containing monolayer is deposited.

The one or more copper-containing monolayers 320 may serve to improve the adhesion of the copper-containing layer 120. For example, the one or more copper-containing monolayers 320 may improve the wetting angle of the one or more aluminum-containing monolayers 310 during a DBC process.

Figure 3D:
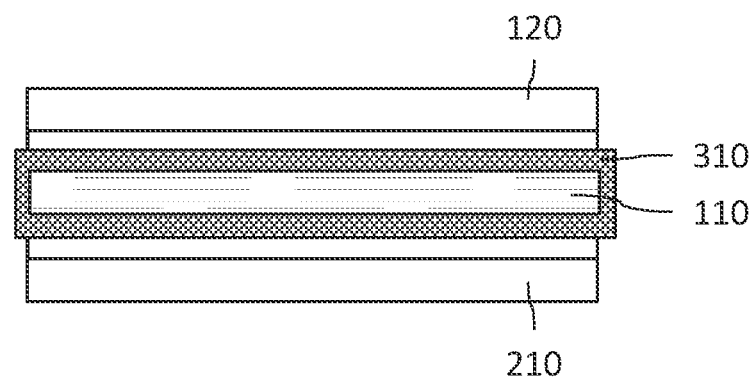

As shown in FIG. 3D, a copper-containing layer 120 is deposited over the one or more aluminum-containing monolayers 310. The deposition may be performed, for example, using a direct bonded copper (DBC) process (which may include, for example, heating a copper preform and the ceramic workpiece 110 with monolayers 310 and 320 disposed thereon in an N atmosphere, the N atmosphere optionally comprising additions of O, and forming a CuO eutectic). In the case that the optional process of depositing the copper-containing monolayers 320 shown in FIG. 3C is not performed, the copper-containing layer 120 may be deposited directly on the one or more aluminum-containing monolayers 310. Otherwise, the copper-containing layer 120 may be deposited directly on the one or more copper-containing monolayers 320.

As shown in FIG. 3D, the second copper-containing layer 210 may be created in the same DBC process as the copper-containing layer 120. However, it is also possible that the second copper-containing layer 210 is created in a separate DBC process or it is possible that only the copper-containing layer 120 is created over the first main side 111 of the ceramic workpiece 110 and no copper-containing layer is deposited on the second main side 112.

Figure 3E:
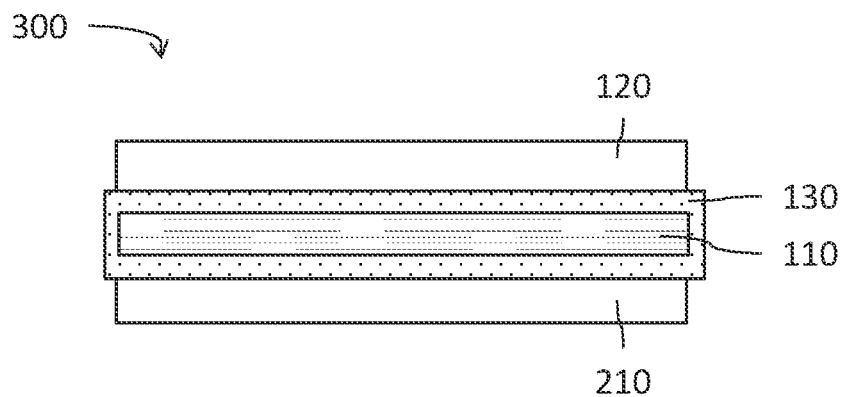

FIG. 3E shows the DBC substrate 300 after the intermediate layer 130 has been formed. The intermediate layer 130 may be the product of a spinel reaction of the ceramic workpiece 110 and/or the aluminum-containing monolayers 310 with copper deposited on the ceramic workpiece 110. According to an example, the aluminum-containing monolayers 310 or the optional copper-containing monolayers 320 may be completely consumed by this reaction such that the DBC substrate 300 is free of the aluminum-containing monolayers 310 or the copper-containing monolayers 320, respectively. According to an example, the intermediate layer 130 may substantially correspond to the aluminum-containing monolayers 310 and the optional copper-containing monolayers 320, except for unavoidable chemical reactions after deposition. For example, the interlayer 130 may consist solely of $Al_2O_3$, or it may additionally comprise $CuAl_2O_4$. In the latter case, the intermediate layer 130 may comprise, for example, two layers, wherein the lower layer disposed on the ceramic workpiece 110 comprises or consists of $Al_2O_3$ and wherein the upper layer comprises or consists of $CuAl_2O_4$.

According to an example, the method disclosed herein can produce a plurality of interconnected DBC substrates 300 that are subsequently separated into individual DBC substrates 300 by a cutting process.

Figure 4A:
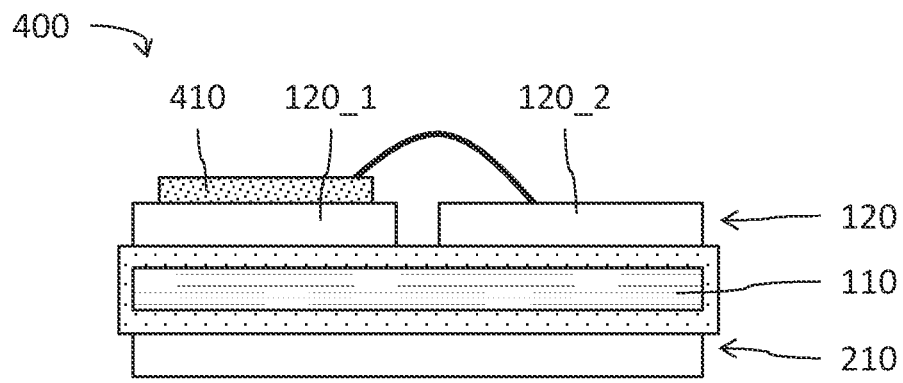
FIGS. 4A and 4B show sectional views of power semiconductor devices with DBC substrates.
Figure 4B:
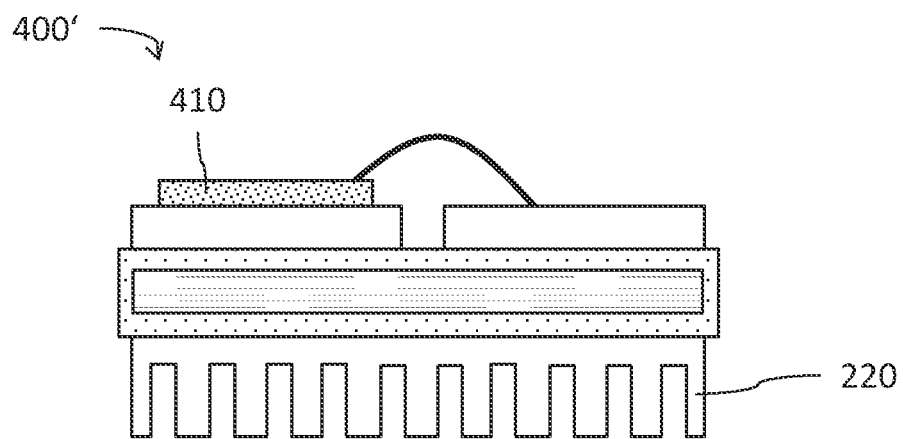

FIGS. 4A and 4B illustrate exemplary power semiconductor modules or power semiconductor devices 400 and 400' in which the DBC substrates described herein may be used.

FIG. 4A illustrates a power semiconductor module 400 having a power semiconductor chip 410 that is disposed on and that may be electrically connected to the copper-containing layer 120. The copper-containing layer 120 is patterned to provide connection regions 120_1, 120_2 that are electrically isolated from each other. The power semiconductor module 400 further comprises the second copper-containing layer 210 and the power semiconductor module 400 is for example configured for indirect cooling (no direct contact between the DBC substrate and the cooling fluid).

FIG. 4B shows a power semiconductor module 400' that comprises the cooling fins 220 and that is configured for direct liquid cooling. In the example shown in FIG. 4B, the cooling fins 220 are formed in the ceramic workpiece 110. However, it is also possible that the cooling fins are formed in a second layer containing aluminum.

Figure 5:
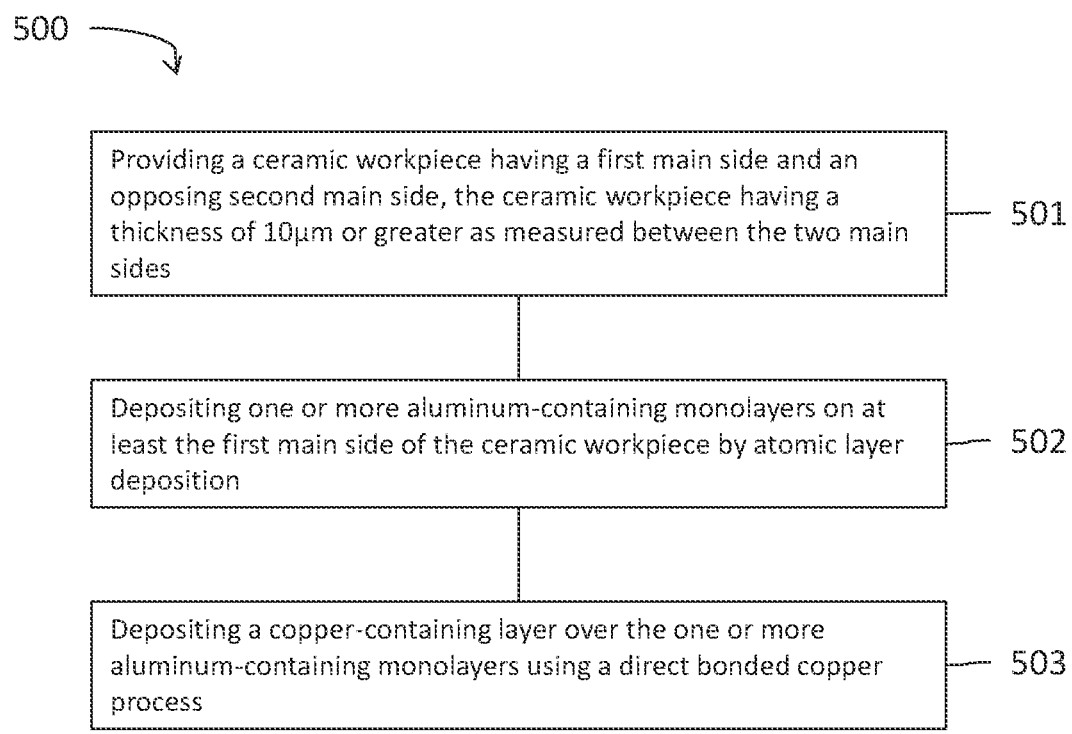
FIG. 5 is a flowchart of an exemplary method for fabricating DBC substrates.

FIG. 5 is a flowchart of a method 500 for manufacturing a DBC substrate. The method 500 can be used, for example, to manufacture DBC substrates 100, 200, 200', and 300.

The method 500 comprises, at 501, an act of providing a ceramic workpiece having a first main side and an opposing second main side, the ceramic workpiece having a thickness of 10 μm or greater as measured between the two main sides. The method 500 comprises, at 502, an act of depositing one or more aluminum-containing monolayers on at least the first main side of the ceramic workpiece by atomic layer deposition. The method 500 comprises, at 503, an act of depositing a copper-containing layer over the one or more aluminum-containing monolayers using a direct bonded copper process.

The method 500 may optionally comprise an act of depositing one or more copper-containing monolayers on the one or more aluminum-containing monolayers using atomic layer deposition. The method 500 may optionally comprise an act of patterning the copper-containing layer to create interconnect regions and/or conductive traces. According to an example, the method 500 is performed as a batch process, wherein the DBC substrate is produced as part of a composite, and wherein the method 500 further comprises an act of singulating the composite into a plurality of DBC substrates.

According to another example of the method 500, the ceramic workpiece has lateral sides connecting the two main sides, wherein the optional act of depositing the one or more aluminum-containing monolayers can also be performed on the lateral sides.

In the following, the DBC substrate, the method for fabricating DBC substrates, and the power semiconductor device are explained with reference to specific examples.

Example 1 is a DBC substrate for power semiconductor devices, wherein the DBC substrate comprises: a ceramic workpiece of a non-oxide ceramic having a first main side and an opposing second main side, the ceramic workpiece having a thickness of 10 µm or more measured between the two main sides; a copper-containing layer disposed over the first main side, the copper-containing layer having a thickness of 5 µm or more; and an intermediate layer comprising $Al_2O_3$ disposed between the ceramic workpiece and the copper-containing layer.

Example 2 is the DBC substrate of example 1, wherein the intermediate layer further comprises $CuAl_2O_4$, in particular 1 to 30 monolayers of $CuAl_2O_4$, in particular wherein the $CuAl_2O_4$ is disposed as a layer between the copper-containing layer and the $Al_2O_3$.

Example 3 is the DBC substrate of example 1 or 2, wherein the ceramic workpiece further comprises lateral sides connecting the two main sides, the lateral sides being free of the copper-containing layer.

Example 4 is the DBC substrate according to any one of the preceding examples, wherein the copper-containing layer is patterned to comprise connection regions and/or conductive tracks electrically isolated from each other, wherein the intermediate layer is also disposed in trenches between the connection regions and/or the conductive tracks.

Example 5 is the DBC substrate according to any one of the preceding examples, wherein the ceramic workpiece comprises cooling fins on the second main side.

Example 6 is the DBC substrate according to any one of the preceding examples, wherein the intermediate layer comprises 5 to 50 monolayers of $Al_2O_3$, in particular 10 to 30 monolayers of $Al_2O_3$.

Example 7 is the DBC substrate according to any one of the preceding examples, wherein the ceramic workpiece comprises or consists of one or more of $Si_3Ni_4$, AlN, BN, SiC, and BC.

Example 8 is a method of fabricating a DBC substrate, the method comprising: providing a ceramic workpiece of a non-oxide ceramic having a first main side and an opposing second main side, the ceramic workpiece having a thickness of 10 µm or greater as measured between the two main sides, depositing one or more aluminum-containing monolayers on at least the first main side of the ceramic workpiece by atomic layer deposition, and depositing a copper-containing layer over the one or more aluminum-containing monolayers by a direct bonded copper process.

Example 9 is the method of example 8, wherein 5 to 50, in particular 10 to 30, aluminum-containing monolayers are deposited.

Example 10 is the method of example 8 or 9, wherein the method further comprises: depositing one or more copper-containing monolayers on the one or more aluminum-containing monolayers by atomic layer deposition.

Example 11 is the method of example 10, wherein 5 to 50, in particular 10 to 30, copper-containing monolayers are deposited.

Example 12 is the method according to any one of examples 8 to 11, wherein the ceramic workpiece comprises or consists of one or more of $Si_3Ni_4$, AlN, BN, SiC and BC.

Example 13 is the method according to any one of examples 8 to 12, wherein the method further comprises: after performing the direct bonded copper process, patterning the copper-containing layer to create connection regions and/or conductive tracks.

Example 14 is the method of example 13, wherein the DBC substrate is produced as part of a composite in a batch process, and wherein the method further comprises: singulating the composite into a plurality of DBC substrates.

Example 15 is a method according to any one of examples 8 to 14, wherein the aluminum-containing monolayers comprise or consist of $Al_2O_3$.

Example 16 is a power semiconductor device, comprising: a DBC substrate according to any one of examples 1 to 7, and a power semiconductor chip disposed on and electrically connected to the DBC substrate.

Example 17 is the power semiconductor device of example 16, wherein the DBC substrate is configured for direct liquid cooling.

Example 18 is a device having means for performing the method of any one of examples 8 to 15.

Although specific examples have been shown and described herein, it is apparent to one of ordinary skill in the art that a variety of alternative and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and their equivalents.

What is claimed is:

1. A DBC substrate for power semiconductor devices, the DBC substrate comprising:
    a ceramic workpiece of a non-oxide ceramic having a first main side and an opposing second main side, the ceramic workpiece having a thickness of 10 µm or more measured between the first and second main sides;
    a copper-containing layer disposed over the first main side, the copper-containing layer having a thickness of 5 µm or more; and
    an intermediate layer comprising one or more monolayers of $Al_2O_3$ disposed between the ceramic workpiece and the copper-containing layer,
    wherein the intermediate layer further comprises $CuAl_2O_4$ arranged between the copper-containing layer and the one or more monolayers of $Al_2O_3$.

2. The DBC substrate of claim 1, wherein the $CuAl_2O_4$ comprises 1 to 30 monolayers of $CuAl_2O_4$ arranged between the copper-containing layer and the one or more monolayers of $Al_2O_3$.

3. The DBC substrate of claim 1, wherein the ceramic workpiece further comprises lateral sides connecting the first and second main sides, the lateral sides being free of the copper-containing layer.

4. The DBC substrate of claim 1, wherein the copper-containing layer is patterned to comprise connection regions and/or conductive tracks electrically isolated from each other, and wherein the intermediate layer is also disposed in trenches between the connection regions and/or the conductive tracks.

5. The DBC substrate of claim 1, wherein the ceramic workpiece has cooling fins on the second main side.

6. The DBC substrate of claim 1, wherein the intermediate layer comprises 5 to 50 monolayers of $Al_2O_3$.

7. The DBC substrate of claim 6, wherein the intermediate layer comprises 10 to 30 monolayers of $Al_2O_3$.

8. The DBC substrate of claim 1, wherein the ceramic workpiece comprises one or more of $Si_3Ni_4$, AlN, BN, SiC and BC.

9. A method for fabricating a DBC substrate, the method comprising:
proving a ceramic workpiece of a non-oxide ceramic having a first main side and an opposing second main side, the ceramic workpiece having a thickness of 10 µm or greater measured between the first and second main sides;
depositing one or more aluminum-containing monolayers on at least the first main side of the ceramic workpiece by atomic layer deposition; and
depositing a copper-containing layer over the one or more aluminum-containing monolayers by a direct bonded copper process,
wherein 5 to 50 aluminum-containing monolayers are deposited.

10. The method of claim 9, further comprising:
depositing one or more copper-containing monolayers on the one or more aluminum-containing monolayers by atomic layer deposition.

11. The method of claim 10, wherein 5 to 50 copper-containing monolayers are deposited.

12. The method of claim 9, wherein the ceramic workpiece comprises one or more of $Si_3Ni_4$, AlN, BN, SiC and BC.

13. The method of claim 9, further comprising:
after performing the direct bonded copper process, patterning the copper-containing layer to create connection regions and/or conductive tracks.

14. The method of claim 13, wherein the DBC substrate is produced as part of a composite in a batch process, the method further comprising:
separating the composite into a plurality of DBC substrates.

15. The method of claim 9, wherein the aluminum-containing monolayers comprise $Al_2O_3$.

16. A power semiconductor device, comprising:
a DBC substrate comprising a ceramic workpiece of a non-oxide ceramic having a first main side and an opposing second main side, the ceramic workpiece having a thickness of 10 µm or more measured between the first and second main sides, a copper-containing layer disposed over the first main side, the copper-containing layer having a thickness of 5 µm or more, and an intermediate layer comprising one or more monolayers of $Al_2O_3$ disposed between the ceramic workpiece and the copper-containing layer; and
a power semiconductor chip disposed on the DBC substrate and electrically connected thereto,
wherein the intermediate layer further comprises $CuAl_2O_4$ arranged between the copper-containing layer and the one or more monolayers of $Al_2O_3$.

17. The power semiconductor device of claim 16, wherein the DBC substrate is configured for direct liquid cooling.

18. The DBC substrate of claim 1, further comprising:
one or more copper-containing monolayers deposited on the one or more one or more monolayers of $Al_2O_3$ by atomic layer deposition.

* * * * *